(12) United States Patent  
Taylor

(10) Patent No.: US 7,196,555 B2  
(45) Date of Patent: Mar. 27, 2007

(54) APPARATUS AND METHOD FOR VOLTAGE CONVERSION

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 10/957,319

(22) Filed: Sep. 30, 2004

(65) Prior Publication Data

US 2006/0066361 A1   Mar. 30, 2006

(51) Int. Cl.
 *H03K 1/00* (2006.01)
(52) U.S. Cl. ...................................... 327/103; 327/112
(58) Field of Classification Search ................ 323/316; 327/103, 108, 109, 110, 111, 112; 330/252, 330/255, 257, 260, 262, 263, 264, 265, 269, 330/271, 277
See application file for complete search history.

(56) References Cited

U.S. PATENT DOCUMENTS

| 4,689,607 | A | * | 8/1987 | Robinson | .................... 341/135 |
| 5,519,309 | A | * | 5/1996 | Smith | ......................... 323/316 |
| 5,585,763 | A | * | 12/1996 | Navabi et al. | .............. 330/255 |
| 5,777,509 | A | * | 7/1998 | Gasparik | ..................... 327/542 |
| 5,959,475 | A | * | 9/1999 | Zomorrodi | ................... 327/112 |
| 5,963,094 | A | * | 10/1999 | Linder et al. | ............... 330/264 |
| 6,492,796 | B1 | * | 12/2002 | Morley | ....................... 323/316 |
| 6,717,470 | B1 | * | 4/2004 | Bowers | ....................... 330/255 |
| 7,002,403 | B2 | * | 2/2006 | Marholev | ................... 327/552 |

* cited by examiner

*Primary Examiner*—Jeffrey Zweizig
(74) *Attorney, Agent, or Firm*—Schwegman, Lundberg, Woessner & Kluth, P.A.

(57) ABSTRACT

An apparatus includes an input port, an output port, a resistor, and a current amplifier. The current amplifier includes an input circuit and an output circuit. The resistor is coupled to the input port. The input circuit is coupled to the resistor and the output circuit. The output circuit is coupled to the output port, the input circuit and the output circuit. The input circuit and output circuit have substantially identical topologies. A method includes receiving an input voltage signal, converting the input voltage signal to a current signal, and processing the current signal to form a feedback signal and an output current signal that is a substantially linear representation of the input voltage signal.

26 Claims, 4 Drawing Sheets

APPARATUS AND METHOD FOR VOLTAGE CONVERSION

FIELD

The subject matter relates to electronic circuits and more particularly to electronic circuits for the conversion of a voltage to a current.

BACKGROUND

A transconductance amplifier is an electronic building block that converts a voltage to a current. Transconductance amplifiers are useful in building signal processing systems, such as communication systems. One desired property in a transconductance amplifiers is substantially linear voltage-to-current conversion over a wide dynamic range. Unfortunately, some transconductance amplifiers are not substantially linear over a wide dynamic range.

DESCRIPTION

Figure 1A:
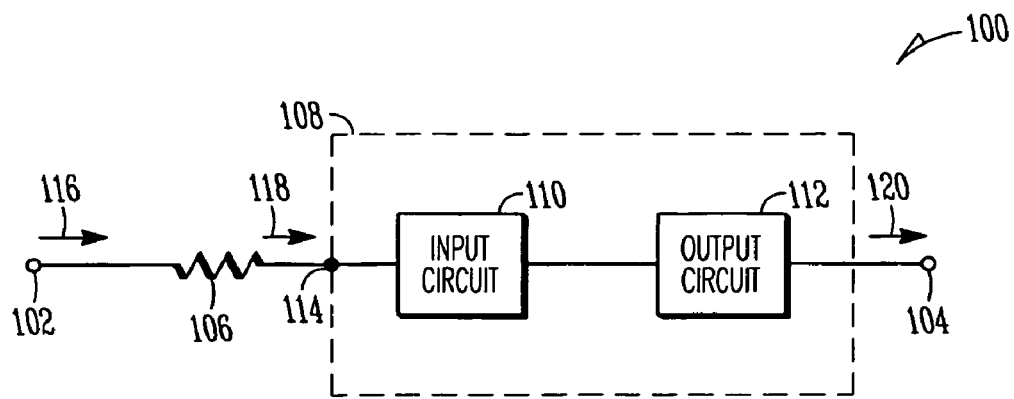
FIG. 1A is an illustration of an apparatus including an input port, an output port, a resistor, and a current amplifier in accordance with some embodiments.

In the following description of some embodiments of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice embodiments of the invention. Other embodiments may be utilized and structural, logical, and electrical changes may be made without departing from the scope of the invention. The following detailed description is not to be taken in a limiting sense, and the scope of the invention is defined only by the appended claims, along with the full scope of equivalents to which such claims are entitled.

FIG. 1A is an illustration of an apparatus 100 including an input port 102, an output port 104, a resistor 106, and a current amplifier 108 in accordance with some embodiments. The current amplifier 108 includes an input circuit 110 and an output circuit 112. The input port 102 is coupled to the resistor 106. The resistor 106 is coupled to the input circuit 110 at an input port 114 of the current amplifier 108. The input circuit 110 is coupled to the output circuit 112. The output circuit 112 is coupled to the output port 104.

The apparatus 100 functions as a transconductance amplifier. A transconductance amplifier converts a voltage signal to a current signal. The current signal provided by a transconductance amplifier is the product of a voltage signal and the transconductance of the amplifier. The transconductance of the apparatus 100 is substantially equal to the reciprocal of the resistance of the resistor 106.

In operation, the apparatus 100 receives a voltage signal 116 at the input port 102, converts the voltage signal 116 to a current signal 118 at the input port 114 of the current amplifier 108, and processes the current signal 118 to form the current signal 120 at the output port 104. The resistor 106 converts the voltage signal 116 to the current signal 118 at the input port 114 of the current amplifier 108. The input circuit 110 of the current amplifier 108 receives an input signal, such as the current signal 118. The output circuit 112 provides an output signal, such as the current signal 120, at the output port 104 of the apparatus 100. The current amplifier 108 processes the current signal 118 to form the current signal 120. The current signal 120 is the product of the voltage signal 116 and the transconductance of the apparatus 100.

The resistor 106 includes electrical resistance. Electrical resistance is the opposition offered by a body or substance to the passage through the body or substance of an electric current. The resistor 106 is not limited to a resistance of a particular value. The value of the resistance of the resistor 106 is selected to provide the apparatus 100 with a desired transconductance. As indicated above, the transconductance of the apparatus 100 is substantially equal to the reciprocal of the resistance of the resistor 106. For example, if the resistance of the resistor 106 is 1000 ohms, then the transconductance of the apparatus 100 is 0.001 mhos.

The resistor 106 is not limited to a particular type of resistor. Exemplary resistors suitable for use in connection with the apparatus 100 include silicon resistors, doped silicon resistors, and polycrystalline silicon resistors. A silicon resistor is formed from silicon. Silicon is a tetravalent nonmetallic element. A doped silicon resistor is formed from doped silicon. Doped silicon is formed by adding impurities to silicon. The impurities have an electronic structure that differs from the electronic structure of silicon. A polycrystalline silicon resistor is formed from silicon having more than one silicon crystal. Polycrystalline silicon is sometimes referred to as polysilicon.

The current amplifier 108 includes the input circuit 110 and the output circuit 112. The topology of a circuit includes circuit elements and the arrangement of the circuit elements. Circuit elements include passive and active elements. Exemplary passive elements include resistors, capacitors, and inductors. Exemplary active elements include transistors and amplifiers. The input circuit 110 has an input circuit topology. The output circuit 112 has an output circuit topology. In some embodiments, the input circuit 110 and the output circuit 112 have substantially identical topologies. For example, if the input circuit 110 includes two transistors connected in series and the output circuit 112 includes two transistors connected in series, then the topology of the input circuit 110 is substantially identical to the topology of the output circuit 112. In some embodiments, the input circuit 110 has a cascode topology. In some embodiments, the output circuit 112 has a cascode topology. A cascode topology includes a pair of transistors having a common drain/source connection. In some embodiments, the input circuit 110 includes a transconductor. In some embodiments, the output circuit 112 includes a transconductor.

The current amplifier 108 includes a gain that substantially defines the amplification provided by the current amplifier 108. The amplification is applied to the current signal 118 to form the current signal 120. The gain of the current amplifier 108 is not limited to a particular value. In some embodiments, the gain is zero or substantially zero. For example, the gain of the current amplifier 108 is zero or substantially zero when the current amplifier 108 is turned off. In some embodiments, the gain is less than zero. In some embodiments, the gain is greater than zero. In some embodiments, the gain is variable. A variable gain is a gain that is not fixed. Rather, a variable gain is a gain that can change. Thus, an amplifier that has a variable gain has a gain that can change. The current signal 120 is substantially equal to the product of the gain of the current amplifier 108 and the current signal 118. For example, if the gain of the current amplifier 108 is ten and the value of the current signal 118 is ten milliamperes, then the current signal 120 has a value of about 100 milliamperes.

In operation, the apparatus 100 functions as a transconductance amplifier that is substantially linear and has a large dynamic range. The voltage signal 116 can be higher or lower than the power supply voltages. However, the voltage signal 116 should not assume values that cause the current amplifier to drive the current signal 120 to a value that exceeds the current capability of the current amplifier 108.

Figure 1B:
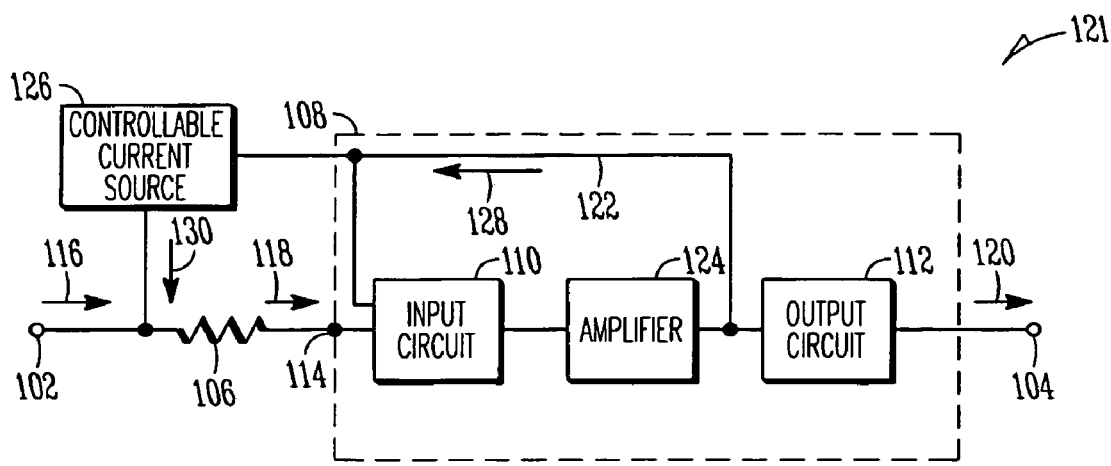
FIG. 1B is an illustration of an apparatus including the input port, the output port, the resistor, and the current amplifier, all shown in FIG. 1A, and a feedback loop, an amplifier, and a controllable current source in accordance with some embodiments.

FIG. 1B is an illustration of an apparatus 121 including the input port 102, the output port 104, the resistor 106, and the current amplifier 108, all shown in FIG. 1A, and a feedback loop 122, an amplifier 124, and a controllable current source 126 in accordance with some embodiments. The current amplifier 108 includes the feedback loop 122. The feedback loop 122 includes the amplifier 124. The amplifier 124 is coupled to the resistor 106, the input circuit 110, and the output circuit 112. The controllable current source 126 is coupled to the input port 102 and the input circuit 110. The input circuit 110 has an input impedance between about one ohm and about one-hundred ohms. The output circuit 112 has an output impedance between about one thousand ohms and about one million ohms.

In operation the feedback loop 122 provides a control signal 128 to the input circuit 110. The control signal 128 provides a signal to the input circuit 110 that maintains the input impedance at the input port 114 at about between one ohm and about one-hundred ohms. In some embodiments, the feedback loop 122 provides the control signal 128 to the controllable current source 126. The control signal 128 provides a signal to the controllable current source 126 to maintain a current signal 130 at the input port 102 to substantially substitute for the current signal 118 generated by the voltage signal 116. A first current signal is a substantial substitute for a second current signal when the amplitude and frequency of the first current signal is substantially equal to the amplitude and frequency of the second current signal. As the voltage 116 approaches the power supply voltages the controllable current source 126 may not provide the current 130 that substitutes for the current 118.

The amplifier 124 provides the amplification to maintain the control signal 128 in the feedback loop 122 at a level to control the impedance at the input port 114 and the current signal 130 at the input port 102. The amplifier 124 provides the control signal 122 to the output circuit 112 to form the current signal 120. The amplifier 124 is not limited to a particular type of amplifier. Exemplary amplifiers suitable for use as the amplifier 124 in connection with the current amplifier 108 include differential amplifiers and operational amplifiers. The gain of differential and operational amplifiers suitable for use as the amplifier 124 in connection with the current amplifier 108 is between about 100 and about 10,000. A gain of between about 100 and about 10,000 substantially linearizes the apparatus 121. The apparatus 121, when operating at a gain of between about 100 and about 10,000, exhibits low harmonic distortion or low intermodulation distortion. For a loop gain of less than about 100 the feedback may be insufficient to substantially linearize the apparatus 121. For a loop gain of more than about 10,000, the feedback may cause the apparatus 121 to be unstable. However, some technologies and circuit topologies may allow for a gain of greater than about 10,000 while maintaining stability.

The controllable current source 126 provides the current signal 130 to substantially substitute for the current signal 118. The controllable current source 126 can regulate the current signal 130. In some embodiments, the controllable current source 126 includes a current mirror. In a current mirror, an input current signal is reflected in an output current signal. Thus, a current mirror can regulate or maintain a substantially constant current signal. The controllable current source 126 is not limited to a particular type of current mirror. An exemplary current mirror suitable for use as the controllable current source 126 in connection with the apparatus 121 is a two-transistor inverting current amplifier.

Figure 2:
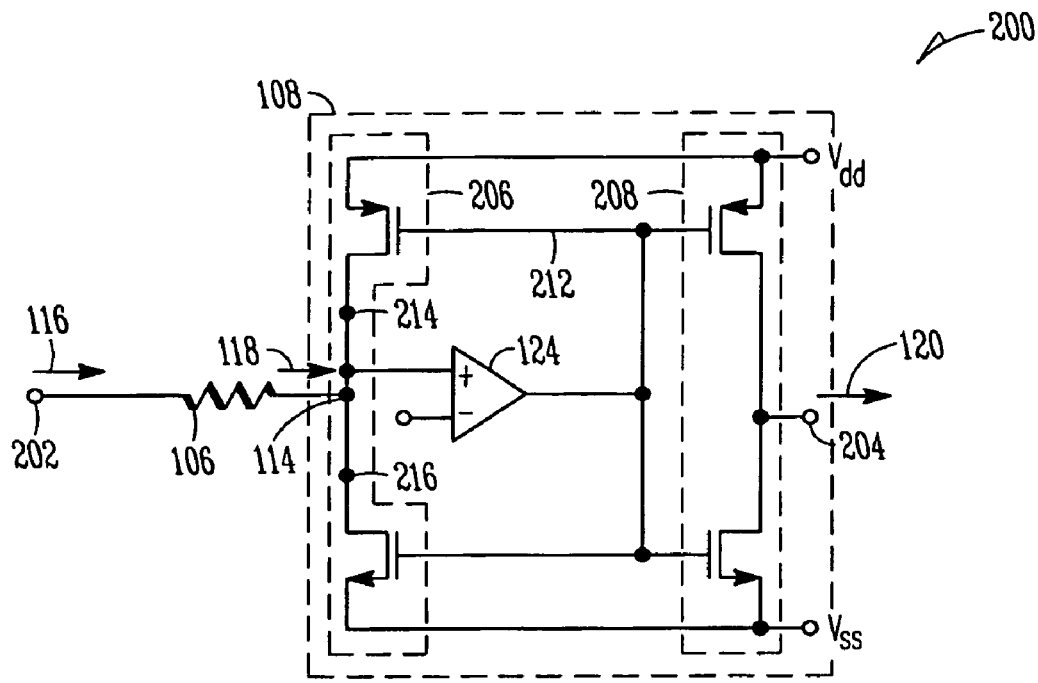
FIG. 2 is an illustration of an apparatus including an input port, an output port, the resistor, shown in FIG. 1A, a first pair of transistors, a second pair of transistors, and the amplifier, shown in FIG. 1B, in accordance with some embodiments.

FIG. 2 is an illustration of an apparatus 200 including an input port 202, an output port 204, the resistor 106, shown in FIG. 1A, a first pair of transistors 206, a second pair of transistors 208, and the amplifier 124, shown in FIG. 1B, in accordance with some embodiments. The first pair of transistors 206 is coupled to the input port 202 through the resistor 106. The second pair of transistors 208 is coupled to the output port 204. The amplifier 124 is coupled to the input port 202, to the first pair of transistors 206, and to the second pair of transistors 208. The second pair of transistors 208 are substantially matched to the first pair of transistors 206. Transistors are substantially matched when they have substantially identical electrical properties, such as input impedance, output impedance, and gain. The first pair of transistors 206 is included in a feedback loop 212. The amplifier 124 is not limited to a particular amplifier configuration. Exemplary amplifiers suitable for use in connection with the apparatus 200 include amplifiers with level shifting circuits and operational amplifiers. The transistors in the first pair of transistors 206 are not limited to being fabricated using a particular type of transistor or using a particular configuration of transistors. In some embodiments, each transistor in the first pair of transistors 206 includes an insulated gate field-effect transistor. In some embodiments, the first pair of transistors 206 are connected in series at drain/source terminals 214 and 216. In some embodiments, each transistor in the first pair of transistors 206 includes a bipolar transistor.

The apparatus 200 functions as a transconductance amplifier. A transconductance amplifier converts a voltage signal to a current signal. The current signal provided by a transconductance amplifier is the product of a voltage signal and the transconductance of the amplifier. The transconductance of the apparatus 200 is substantially equal to the reciprocal of the resistance of the resistor 106.

In operation, the apparatus 200 receives the voltage signal 116 at the input port 202, converts the voltage signal 116 to a current signal 118 at the input port 114 of the current amplifier 108, and processes the current signal 118 to form the current signal 120 at the output port 204. The resistor 106 converts the voltage signal 116 to the current signal 118 at the input port 114 of the current amplifier 108. The first pair of transistors 206 of the current amplifier 108 receives an input signal, such as the current signal 118. The second pair of transistors 208 provides an output signal, such as the current signal 120, at the output port 204 of the apparatus 200. The current amplifier 108 processes the current signal 118 to form the current signal 120. The current signal 120 is the product of the voltage signal 116 and the transconductance of the apparatus 200. The current signal 120 is a substantially linear representation of the voltage signal 116. A substantially linear representation is a representation that is substantially free of distortion.

In operation, the apparatus 200 functions as a transconductance amplifier that is substantially linear and has a large dynamic range. The voltage signal 116 can be higher or lower than the power supply voltages. However, the voltage signal 116 should not assume values that cause the current amplifier to drive the current signal 120 to a value that exceeds the current capability of the current amplifier 108.

Figure 3:
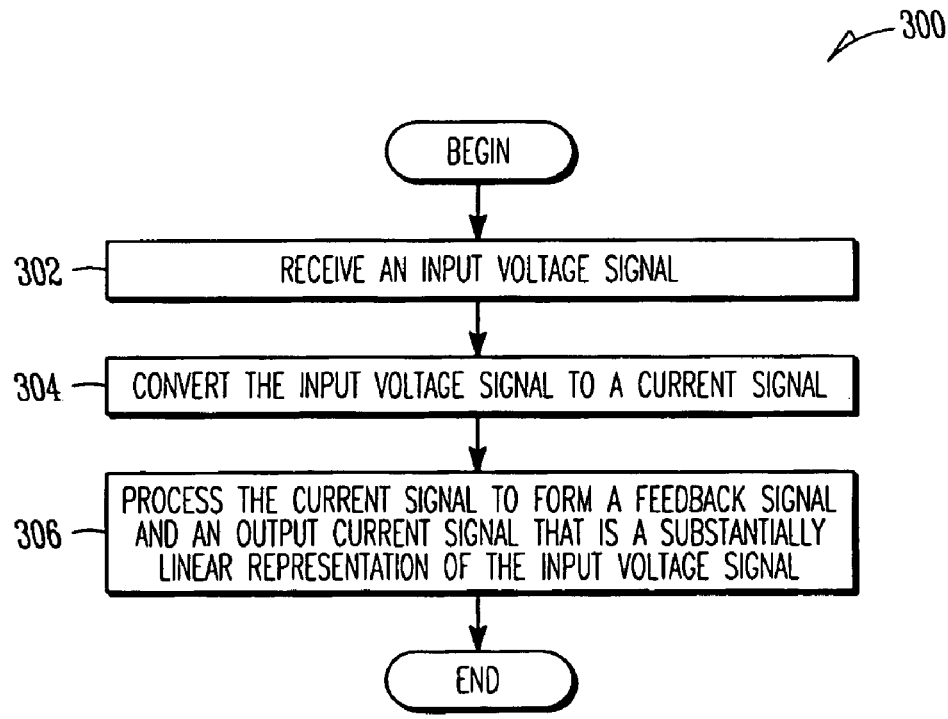
FIG. 3 is a flow diagram of a method including receiving an input voltage signal, converting the input voltage signal to a current signal, and processing the current signal to form a feedback signal and an output current signal that is a substantially linear representation of the input voltage signal in accordance with some embodiments.

FIG. 3 is a flow diagram of a method 300 including receiving an input voltage signal (block 302), converting the input voltage signal to a current signal (block 304), and processing the current signal to form a feedback signal and an output current signal that is a substantially linear representation of the input voltage signal (block 306) in accordance with some embodiments. In some embodiments receiving the input voltage signal includes receiving a signal at an antenna and converting the signal to the input voltage signal. In some embodiments, converting the input voltage signal to the current signal includes driving a resistor with the input voltage signal to convert the input voltage signal to the current signal. In some embodiments, processing the current signal to form the feedback signal and the output current signal that is the substantially linear representation of the input voltage signal includes converting the current signal to an intermediate voltage signal and processing the intermediate voltage signal to form the feedback current signal and the output current signal.

Figure 4:
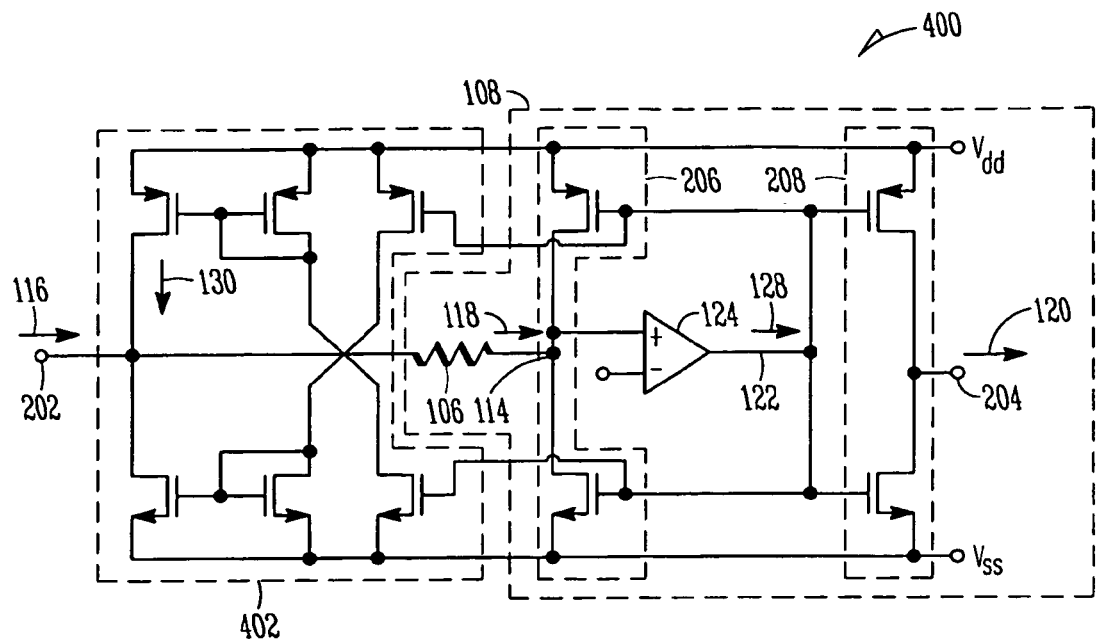
FIG. 4 is an illustration of an apparatus including the input port, the output port, the first pair of transistors, the second pair of transistors, and the amplifier, all shown in FIG. 2, and a plurality of current mirrors in accordance with some embodiments.

FIG. 4 is an illustration of an apparatus 400 including the input port 202, the output port 204, the first pair of transistors 206, the second pair of transistors 208, and the amplifier 124, all shown in FIG. 2, and a plurality of current mirrors 402 in accordance with some embodiments. The apparatus 400 further includes the feedback loop 122 that includes the amplifier 124. The feedback loop 122 couples the amplifier 124 to the first pair of transistors 206 and the current mirrors 402. The first pair of transistors 206 is coupled to the input port 202. The second pair of transistors 208 is coupled to the output port 204. The plurality of current mirrors 402 is coupled to the first pair of transistors 206 and to the input port 202. The amplifier 124 is coupled to the input port 202, to the first pair of transistors 206, and to the second pair of transistors 208.

The plurality of current mirrors 402 is not limited to being fabricated using a particular type of transistor. Exemplary types of transistors suitable use in connection with the fabrication of the plurality of current mirrors 402 include insulated gate field-effect transistors and bipolar transistors. In some embodiments, the resistor 106 couples the input port 202 to the first pair of transistors 206.

The apparatus 400 functions as a transconductance amplifier. A transconductance amplifier converts a voltage signal to a current signal. The current signal provided by a transconductance amplifier is the product of a voltage signal and the transconductance of the amplifier. The transconductance of the apparatus 400 is substantially equal to the reciprocal of the resistance of the resistor 106.

In operation, the apparatus 400 receives the voltage signal 116 at the input port 202, converts the voltage signal 116 to a current signal 118 at the input port 114 of the current amplifier 108, and processes the current signal 118 to form the current signal 120 at the output port 204. The resistor 106 converts the voltage signal 116 to the current signal 118 at the input port 114 of the current amplifier 108. The first pair of transistors 206 of the current amplifier 108 receives an input signal, such as the current signal 118. The second pair of transistors 208 provides an output signal, such as the current signal 120, at the output port 204 of the apparatus 400. The current amplifier 108 processes the current signal 118 to form the current signal 120. The current signal 120 is the product of the voltage signal 116 and the transconductance of the apparatus 400. The current signal 120 is a substantially linear representation of the voltage signal 116.

In operation the feedback loop 122 provides a control signal 128 to the first pair of transistors 206. The control signal 128 provides a signal to the first pair of transistors 206 that maintains the input impedance at the input port 114 at between about one ohm and about one-hundred ohms. The feedback loop 122 provides the control signal 128 to the plurality of current mirrors 402. The control signal 128 provides a signal to the plurality of current mirrors 402 to maintain a current signal 130 at the input port 202 to substantially substitute for the current signal 118 generated by the voltage signal 116. As the voltage 116 approaches the power supply voltages the plurality of current mirrors 402 may not provide the current 130 that substitutes for the current 118.

In operation, the apparatus 400 functions as a transconductance amplifier that is substantially linear and has a large dynamic range. The voltage signal 116 can be higher or lower than the power supply voltages. However, the voltage signal 116 should not assume values that cause the current amplifier to drive the current signal 120 to a value that exceeds the current capability of the current amplifier 108.

Figure 5:
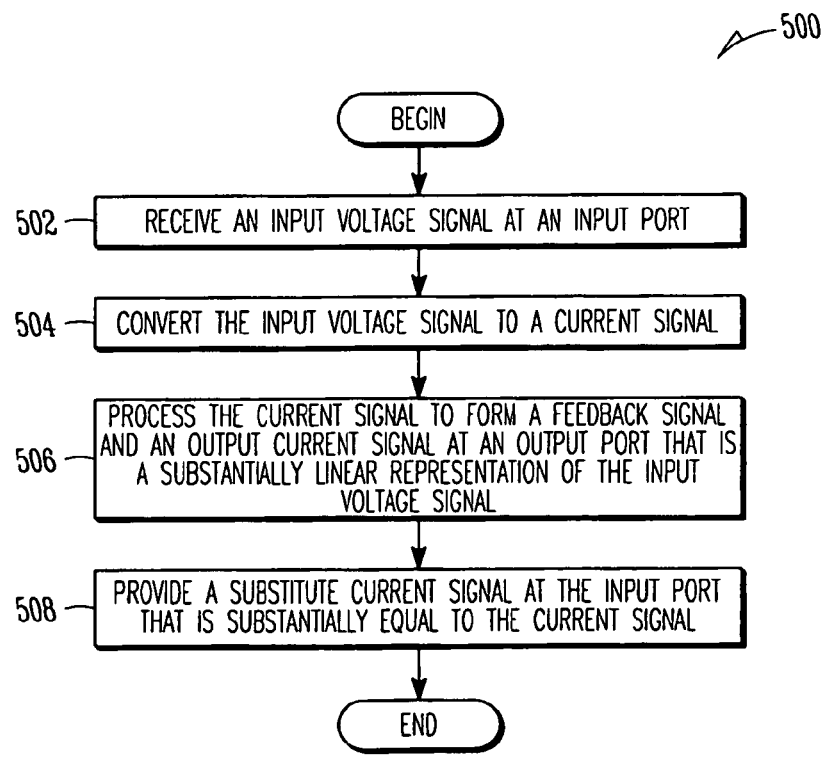
FIG. 5 is a flow diagram of a method including receiving an input voltage signal at an input port, converting the input voltage signal to a current signal, processing the current signal to form a feedback signal and an output current signal at an output port that is a substantially linear representation of the input voltage signal, and providing a substitute current signal at the input port that is substantially equal to the current signal in accordance with some embodiments.

FIG. 5 is a flow diagram of a method 500 including receiving an input voltage signal at an input port (block 502), converting the input voltage signal to a current signal (block 504), processing the current signal to form a feedback signal and an output current signal at an output port that is a substantially linear representation of the input voltage signal (block 506), and providing a substitute current signal at the input port that is substantially equal to the current signal (block 508) in accordance with some embodiments. In some embodiments, providing the substitute current signal at the input port that is substantially equal to the current signal includes driving a current mirror with the feedback signal. In some embodiments, converting the input voltage signal to the current signal includes driving a resistor with the voltage signal. In some embodiments, receiving the input voltage signal includes receiving a digital signal.

Figure 6:
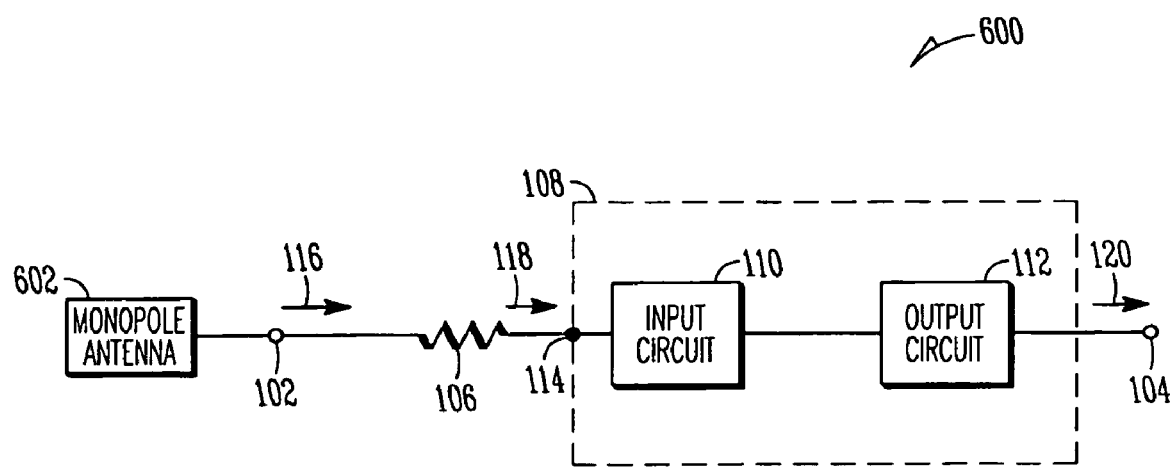
FIG. 6 is an illustration of a system including the input port, the output port, the resistor, and the current amplifier, all shown in FIG. 1A, and a monopole antenna in accordance with some embodiments.

FIG. 6 is an illustration of a system 600 including the input port 102, the output port 104, the resistor 106, and the current amplifier 108, all shown in FIG. 1A, and a monopole antenna 602 in accordance with some embodiments. The current amplifier 108 includes the input circuit 110 and the output circuit 112. The monopole antenna 602 is coupled to the input port 102. The input port 102 is coupled to the resistor 106. The resistor 106 is coupled to the input circuit 110 at the input port 114 of the current amplifier 108. The input circuit 110 is coupled to the output circuit 112. The output circuit 112 is coupled to the output port 104.

The monopole antenna 602 is a resonant antenna with one driven conductive element. The coupling between the monopole antenna 602 and the input port 102 is not limited to a particular type of coupling element. Active, passive, and combinations of active and passive coupling elements are suitable for use in connection with the monopole antenna 602 in the system 600.

In operation, the monopole antenna 602 provides a signal that forms the voltage signal 116 at the input port 102. The voltage signal 116 is processed to form the current signal 118. The current signal 118 is processed by the current amplifier 108 to form the current signal 120 at the output port 104.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the invention. Therefore, it is intended that this invention be limited only by the claims and the equivalents thereof.

What is claimed is:

1. An apparatus comprising:
    an input port and an output port;
    a resistor coupled to the input port; and
    a current amplifier including an operational amplifier and no more than four transistors coupled to the operational amplifier, including an input circuit including two of the no more than four transistors coupled to the resistor and an output circuit including two of the no more than four transistors, the output circuit coupled to the output port, the input circuit and the output circuit having substantially identical topologies.

2. The apparatus of claim 1, wherein the current amplifier comprises a feedback loop.

3. The apparatus of claim 2, further comprising the operational amplifier included in the feedback loop and the operational amplifier coupled to the resistor, the input circuit and the output circuit.

4. The apparatus of claim 1, further comprising a controllable current source coupled to the input port and the input circuit.

5. The apparatus of claim 1, wherein the output circuit comprises a cascode topology.

6. The apparatus of claim 5, wherein the input circuit comprises a transconductor.

7. An apparatus comprising:
    an input port and an output port;
    a first pair of transistors coupled to the input port;
    a second pair of transistors coupled to the output port, the second pair of transistors substantially matched to the first pair of transistors, wherein the apparatus includes no more than four transistors coupled to an operational amplifier; and
    the operational amplifier coupled to the input port, to the first pair of transistors, and to the second pair of transistors, the apparatus to receive a voltage signal at the input port and to provide, at the output port, a current signal that is a substantially linear representation of the voltage signal.

8. The apparatus of claim 7, wherein the first pair of transistors is included in a feedback loop.

9. The apparatus of claim 7, wherein the operational amplifier includes an output coupled to a gate of each of the no more than four transistors.

10. The apparatus of claim 7, wherein each transistor in the first pair of transistors comprises an insulated gate field-effect transistor.

11. The apparatus of claim 10, wherein the first pair of transistors are connected in series at drain/source terminals.

12. The apparatus of claim 7, wherein the first pair of transistors comprises a transconductor.

13. A method comprising:
    receiving an input voltage signal;
    converting the input voltage signal to a current signal; and
    processing the current signal to form a feedback signal and an output current signal that is a substantially linear representation of the input voltage signal, wherein processing the current signal to form the feedback signal and the output signal includes processing the current signal using a current amplifier including no more than four transistors coupled to an operational amplifier.

14. The method of claim 13, wherein receiving the input voltage signal comprises receiving a signal at an antenna and converting the signal to the input voltage signal.

15. The method of claim 13, wherein converting the input voltage signal to the current signal comprises driving a resistor with the input voltage signal to convert the input voltage signal to the current signal.

16. The method of claim 13, wherein processing the current signal to form the feedback signal and the output current signal that is the substantially linear representation of the input voltage signal comprises converting the current signal to an intermediate voltage signal and processing the intermediate voltage signal to form the feedback current signal and the output current signal.

17. An apparatus comprising:
    an input port and an output port;
    a first pair of transistors coupled to the input port;
    a second pair of transistors coupled to the output port;
    a pair of current mirrors coupled to the first pair of transistors and to the input port; and
    an amplifier coupled to the input port, to the first pair of transistors, and to the second pair of transistors, the apparatus to receive a voltage signal at the input port and to provide, at the output port, a current signal that is a substantially linear representation of the voltage signal, and the pair of current mirrors to provide a substitute current, at the input port, having a value substantially equal to the current signal.

18. The apparatus of claim 17, wherein each current mirror in the pair of current mirrors includes an insulated gate field-effect transistor.

19. The apparatus of claim 18, wherein a resistor couples the input port to the first pair of transistors.

20. A method comprising:
    receiving an input voltage signal at an input port;

converting the input voltage signal to a current signal;

processing the current signal to form a feedback signal and an output current signal at an output port that is a substantially linear representation of the input voltage signal; and providing a substitute current signal at the input port that is substantially equal to the current signal.

21. The method of claim 20, wherein providing the substitute current signal at the input port that is substantially equal to the current signal comprises driving a current mirror with the feedback signal.

22. The method of claim 21, wherein converting the input voltage signal to the current signal comprises driving a resistor with the voltage signal.

23. The method of claim 22, wherein receiving the input voltage signal comprises receiving a digital signal.

24. A system comprising:

an input port and an output port;

a resistor coupled to the input port;

a current amplifier including an input circuit coupled to the resistor and an output circuit and the output circuit coupled to the output port, the input circuit and the output circuit having substantially identical topologies; and a monopole antenna coupled to the input port.

25. The system of claim 24, wherein the resistor comprises polycrystalline silicon.

26. The system of claim 24, wherein the input circuit is formed from bipolar transistors.

* * * * *